(12) United States Patent
Wen et al.

(10) Patent No.: US 8,559,821 B2
(45) Date of Patent: Oct. 15, 2013

(54) WAVELENGTH STABILIZATION AND LOCKING FOR COLORLESS DENSE WAVELENGTH DIVISION MULTIPLEXING TRANSMITTERS

(75) Inventors: Yang Jing Wen, Cupertino, CA (US); Jizhong Liu, Sunnyvale, CA (US); Yu Sheng Bai, Los Altos Hills, CA (US)

(73) Assignee: Futurewei Technologies, Inc., Plano, TX (US)

( * ) Notice: Subject to any disclaimer, the term of this patent is extended or adjusted under 35 U.S.C. 154(b) by 485 days.

(21) Appl. No.: 12/629,425

(22) Filed: Dec. 2, 2009

(65) Prior Publication Data

US 2011/0129227 A1 Jun. 2, 2011

(51) Int. Cl.
*H04J 14/02* (2006.01)

(52) U.S. Cl.
USPC ............... 398/79; 398/82; 398/95; 398/182; 398/184

(58) Field of Classification Search
USPC ........... 398/182, 79, 82, 93–95, 87, 152, 184, 398/195, 196, 197, 201; 372/20, 34, 372/29.011, 44.01, 106, 29.01, 29.014, 372/29.02
See application file for complete search history.

(56) References Cited

U.S. PATENT DOCUMENTS

| | | | | |
|---|---|---|---|---|
| 5,089,786 A | * | 2/1992 | Tamura | 359/333 |
| 5,742,416 A | * | 4/1998 | Mizrahi | 398/92 |
| 5,793,784 A | * | 8/1998 | Wagshul et al. | 372/32 |
| 5,949,801 A | * | 9/1999 | Tayebati | 372/20 |
| 6,477,190 B1 | | 11/2002 | Komiyama et al. | |
| 6,977,763 B1 | * | 12/2005 | Wang et al. | 359/246 |
| 7,031,354 B2 | * | 4/2006 | Cheng et al. | 372/29.02 |
| 7,031,355 B2 | * | 4/2006 | Khazaei et al. | 372/32 |
| 7,099,530 B2 | * | 8/2006 | Shin et al. | 385/27 |
| 7,130,320 B2 | | 10/2006 | Tobiason et al. | |
| 7,149,431 B2 | | 12/2006 | Jung et al. | |
| 7,167,649 B2 | * | 1/2007 | Song et al. | 398/72 |
| 7,295,778 B2 | | 11/2007 | Lee et al. | |
| 7,313,157 B2 | * | 12/2007 | Sorin et al. | 372/50.1 |
| 7,596,315 B2 | * | 9/2009 | Nakashima et al. | 398/34 |
| 8,417,118 B2 | * | 4/2013 | Bai | 398/65 |
| 2003/0185258 A1 | * | 10/2003 | Dyer et al. | 372/29.02 |
| 2003/0206740 A1 | * | 11/2003 | Lee et al. | 398/79 |
| 2004/0067059 A1 | * | 4/2004 | Song et al. | 398/82 |

(Continued)

OTHER PUBLICATIONS

Hann, Swook, et al., "Direct-Modulated Upstream Signal Transmission Using a Self-Injection Locked F-P LD for WDM-PON," ECOC, papwer We3.3.3, 2005.

(Continued)

*Primary Examiner* — Daniel Washburn
*Assistant Examiner* — Hibret Woldekidan
(74) *Attorney, Agent, or Firm* — Conley Rose, P.C.; Grant Rodolph; Jonathan K. Polk

(57) ABSTRACT

An apparatus comprising a laser transmitter having a first side and a second side, a filter coupled to the first side, a detector coupled to the second side, and a temperature controller coupled to the laser transmitter and the detector. Also disclosed is an apparatus comprising at least one processor configured to implement a method comprising receiving a photocurrent of a backward light from a laser, determining a wavelength shift offset between a wavelength of the output light and a filter transmission peak, and adjusting a temperature of the laser to substantially reduce the wavelength shift and align the wavelength of the output light with the filter transmission peak.

14 Claims, 8 Drawing Sheets

(56) References Cited

U.S. PATENT DOCUMENTS

| | | | |
|---|---|---|---|
| 2006/0083515 | A1 | 4/2006 | Hann et al. |
| 2007/0047608 | A1 | 3/2007 | Volodin et al. |
| 2008/0123703 | A1* | 5/2008 | Mohrdiek et al. ....... 372/29.021 |
| 2008/0159340 | A1* | 7/2008 | Daiber et al. .................... 372/20 |
| 2008/0279557 | A1* | 11/2008 | Park et al. ........................ 398/79 |
| 2009/0047014 | A1* | 2/2009 | Irie .................................. 398/23 |
| 2010/0316378 | A1* | 12/2010 | Yeh et al. ......................... 398/58 |
| 2011/0038635 | A1 | 2/2011 | Bai |
| 2012/0141128 | A1* | 6/2012 | Bai et al. .......................... 398/65 |
| 2012/0269516 | A1* | 10/2012 | Liu et al. .......................... 398/72 |

OTHER PUBLICATIONS

Martinelli, M., "A Universal Compensator for Polarization Changes Induced by Birefringence on a Retracing Beam," Optics Communications, vol. 72, No. 6, Aug. 1989, pp. 341-344.

Wong, E., et al., "Directly-Modulated Self-Seeding Reflective SOAs as Colorless Transmitters for WDM Passive Optical Networks," OFC 2006, PDP49, 2006.

Bai, Y.S., U.S. Appl. No. 12/619,717; Title: "Colorless Dense Wavelength Division Multiplexing Transmitters,"; Filing Date: Nov. 17, 2009; Specification 26 pages; 7 Drawing Sheets (Figs. 1-7).

Vyrsokinos, K., et al., "Polarization Insensitive NOLM Employing a Faraday Rotator Mirror," ECOC 2004, Tech. Dig., We.4, 2004, p. 14.

Khazanov, Efim, "Novel Faraday Mirror for Lasers with High Average Power," CLEO 2001, CtuM49, 2001, p. 190.

Foreign communication from a counterpart application, PCT application, PCT/US2010/025477, International Search Report and Written Opinion dated Aug. 19, 2010, 13 pages.

Foreign Communication From a Counterpart Application, Chinese Application 201080029552.5, Chinese Office Action dated Oct. 10, 2012, 6 pages.

Foreign Communication From a Counterpart Application, Chinese Application 201080029552.5, English Translation of Chinese Office Action dated Oct. 10, 2012, 6 pages.

Foreign Communication From A Counterpart Application, Chinese Application No. 201080029552.5, Chinese Office Action dated Jul. 2, 2013, 7 pages.

Foreign Communication From A Counterpart Application, Chinese Application No. 201080029552.5, Partial English Translation of Chinese Office Action dated Jul. 2, 2013, 9 pages.

* cited by examiner

WAVELENGTH STABILIZATION AND LOCKING FOR COLORLESS DENSE WAVELENGTH DIVISION MULTIPLEXING TRANSMITTERS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

In optical networks, wavelength division multiplexing (WDM) transmission systems are often used, e.g. in Synchronous Optical Networking (SONET)/Synchronous Digital Hierarchy (SDH) networks and Passive Optical Networks (PONs). The WDM transmission systems transmit a plurality of signals at a plurality of wavelengths that meet a multiplexer/demultiplexer grid. WDM transmission systems based on coherent light sources have been used, such as distributed feedback (DFB) lasers, which have different output wavelengths. Typically, a relatively large number of DFB lasers are needed for network operations and inventory, which increases cost. To reduce the amount of inventory, laser diodes that have tunable wavelengths may be used instead of the DFB lasers. However, because of the relatively high cost of the tunable laser diodes, the overall system cost may not be significantly reduced. To reduce the cost of WDM transmission systems, broadband incoherent light sources with spectrum-slicing schemes may be used instead of coherent light sources. The incoherent light sources include light emitting diodes (LEDs), free-running Fabry-Perot laser diodes (FPLDs), and sources based on amplified spontaneous emission (ASE) noise. The LEDs and FPLDs can be directly modulated, while external modulators are needed to modulate the ASE noise based sources. The spectrum-slicing of such incoherent light sources can introduce relatively strong noise and low data rates, which is not suitable for Gigahertz (GHz) communications.

Subsequently, low-cost high-speed WDM light sources have been introduced, such as using external seeding FPLDs or reflective semiconductor optical amplifiers (RSOAs). Such FPLDs or RSOAs use seeding light to emit substantially coherent light. The external seeding FPLDs and RSOAs are attractive because they can be used for colorless transmitters, where a plurality of such sources that are configured similarly may be coupled to a WDM filter and used to provide a plurality of distinct wavelengths in WDM networks. The colorless aspect of such sources reduces the amount of required inventory. However, such external seeding sources require seeding light based on either continuous wave (CW) or broadband incoherent light sources, such as spectrum-sliced ASE noise based sources, which increases cost.

SUMMARY

In one embodiment, the disclosure includes a laser transmitter having a first side and a second side, a filter coupled to the first side, a detector coupled to the second side, and a temperature controller coupled to the laser transmitter and the detector.

In another embodiment, the disclosure includes an apparatus comprising at least one processor configured to implement a method comprising receiving a photocurrent of a backward light from a laser, determining a wavelength shift offset between a wavelength of the output light and a filter transmission peak, and adjusting a temperature of the laser to substantially reduce the wavelength shift and align the wavelength of the output light with the filter transmission peak.

In yet another embodiment, the disclosure includes a method comprising correlating a detected photocurrent of a backward light from a laser with a wavelength shift between a wavelength of an output light and a filter transmission peak, and thermally tuning the wavelength of the laser to substantially maximize the detected photocurrent and substantially minimize the wavelength shift.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
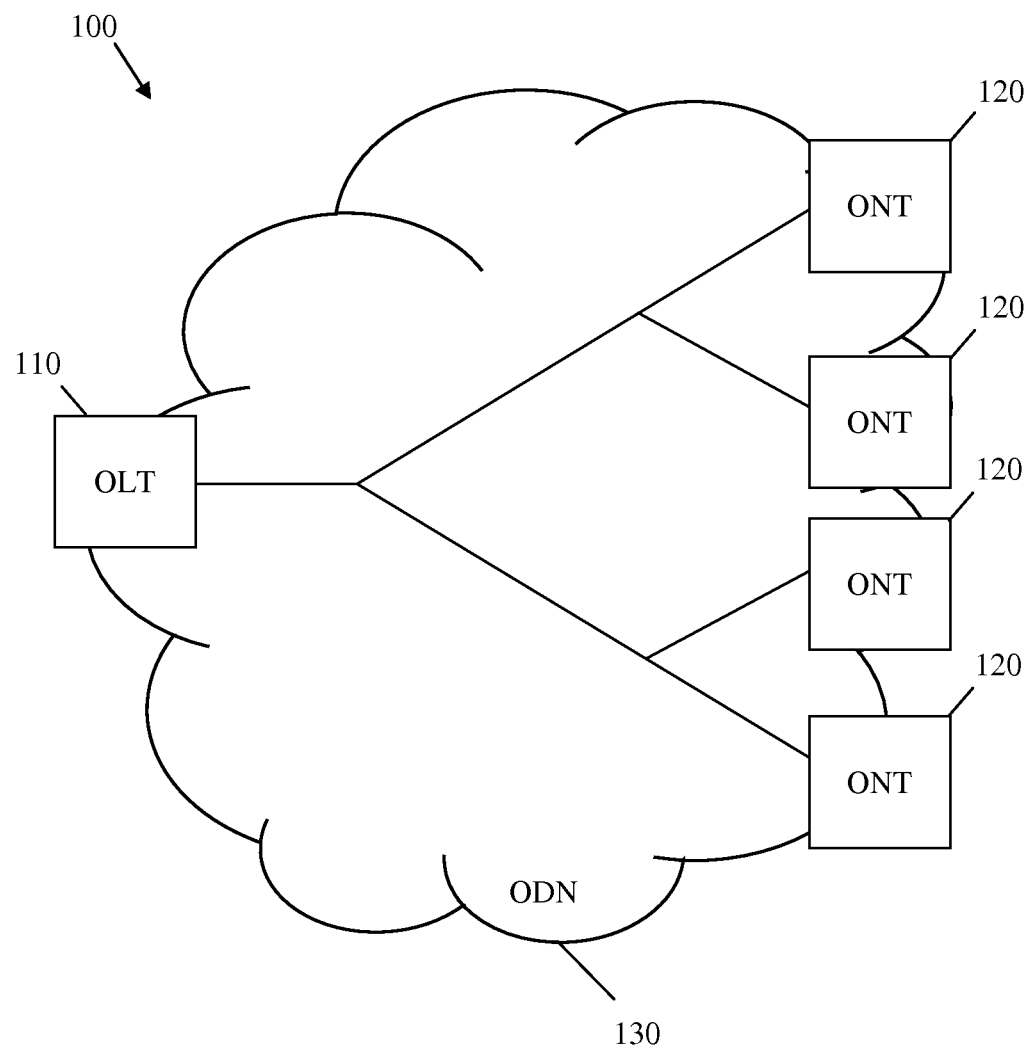
FIG. 1 is a schematic diagram of an embodiment of a PON.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Recently, low-cost high-speed WDM light sources using self-seeding FPLDs and RSOAs have been introduced, which eliminates the requirement of using costly external seeding light sources. A self-seeded RSOA based transmitter was proposed for a WDM PON in U.S. Pat. No. 7,295,778 issued Nov. 13, 2007 to Lee et al. and entitled "Wavelength Division Multiplexed Passive Optical Network System," which is incorporated herein by reference as if reproduced in its entirety. The self-seeded RSOA based transmitter may comprise a reflective fiber Bragg grating (FBG) coupled to each RSOA in the transmitter. The FBG may be used as reflector and wavelength selector. The RSOA and the FBG may determine a cavity, where the wavelength may be determined by the FBG. Another similar transmission system was introduced in U.S. Patent Application Publication No. 2008/0279557 filed Nov. 13, 2008 by Park et al. and entitled "WDM-PON System Using Self-Injection Locking, Optical Line Terminal Thereof, and Data Transmission Method," which is incorporated herein by reference as if reproduced in its entirety. The transmission system may also comprise a grating for each RSOA. However, the grating may be located in a multiplexer, e.g. an arrayed waveguide grating (AWG), instead of the RSOA. Another improved transmitter was proposed in Optical Fiber Communications (OFC) conference 2006 proceedings by Wong et al. and entitled "Directly-Modulated Self-Seeding Reflective SOAs as Colorless Transmitters for WDM Passive Optical Networks," which is incorporated herein by reference as if reproduced in its entirety. The improved transmitter may comprise a reflector for each RSOA coupled to an AWG and located at a remote node from the RSOA. The reflector may be an optical circulator and the AWG may perform wavelength selection.

Further, a self-seeded FPLD based transmitter was proposed in U.S. Patent Application Publication No. 2006/0083515 filed Apr. 20, 2006 by Hann et al. and entitled "WDM-PON Having Optical Source of Self-Injection Locked Fabry-Perot Laser Diode," which is incorporated herein by reference as if reproduced in its entirety. The self-seeded FPLD based transmitter may comprise a FBG for each FPLD located at an optical network terminal (ONT). The FBG may be located with a wavelength router at a remote node from the ONT and the FPLD may be self-seeded by the corresponding FBG. The FP laser may be operated under CW condition and its output may be modulated using an external modulator coupled to the remote node via a distribution fiber. Thus, each transmitter may require two distribution fibers to provide reflected light and modulated light, which may increase system cost. A modified transmission system was proposed in European Conference on Optical Communications (ECOC) 2005 proceedings, by Hann et al. and entitled "Directly-Modulated Upstream Signal Transmission Using a Self-Injection Locked F-P LD for WDM-PON," which is incorporated herein by reference as if reproduced in its entirety. The modified transmitter may also comprise a FBG located at a remote node for each FPLD located at an ONT. However, the output of FP laser may be modulated directly using modulation data instead of CW operation.

Another improved transmission system was proposed in U.S. Pat. No. 7,167,649 issued Jan. 23, 2007 to Song et al. and entitled "Dense Wavelength Division Multiplexing-Passive Optical Network System Utilizing Self-Injection Locking of Fabry-Perot Laser Diodes," which is incorporated herein by reference as if reproduced in its entirety. The improved transmission system may comprise a shared WDM multiplexer (e.g. AWG) for a plurality of ONTs. For each ONT transmitter, the FPLD may be self-seeded by a partially reflective mirror, which may be shared by the ONTs and located in front of the transmitter and the WDM multiplexer. The partially reflective mirror may transmit a portion of the light from the FPLD and reflect another portion of light back to the FPLD. The wavelength selection of light from the FPLD may be realized by the corresponding passband of the multiplexer, e.g. of the corresponding port. Similarly, a shared WDM multiplexer was proposed in U.S. Pat. No. 7,149,431 issued Dec. 12, 2006 to Jung et al. and entitled "Self-Seeded Fabry-Perot Laser Device for Wavelength Division Multiplexing System," which is incorporated herein by reference as if reproduced in its entirety. However, instead of using the partially reflective mirror as a reflector with the shared WDM multiplexer, a circulator having an optical feedback loop may be used. The optical feedback loop may comprise an optical amplifier to amplify the feedback (or reflected) light.

All the proposed transmission systems above may suffer from mode polarization instability, where the polarization of the reflected light may not be aligned with the polarization of the light in the laser cavity. The reflected light may have any polarization due to inherent birefringence in the fibers that couple between the components. The birefringence in fibers may vary with changes to the environment, such as vibrations and temperature variations, and therefore the polarization of the reflected light may vary with time, which may cause unstable laser output over time.

A WDM transmission system for improving the operation of the single mode laser in optical networks (e.g. WDM PONs) is proposed in U.S. patent application Ser. No. 12/169,717 filed Nov. 17, 2009 by Yu Sheng Bai and entitled "Method and Apparatus for Colorless Dense Wavelength Division Multiplexing Transmitters," which is incorporated herein by reference as if reproduced in its entirety. The single mode laser may be a FP laser (e.g. FPLD) or a RSOA. The laser may be configured to operate at a selected wavelength and a single polarization. The laser design may be improved to provide stable laser operation and maintain the output wavelength and/or intensity. Specifically, the laser may be configured to allow back into the laser cavity a portion of the reflected light that may have the same polarization of the light in the FP laser and to substantially isolate reflected light that may have a different polarization. Since the light that is reflected back into the laser cavity may have substantially the same polarization as the light inside the laser cavity, the operation of the FP laser may remain stable and hence its output wavelength and/or intensity may be maintained. Improving the operation of the single mode laser may reduce the cost of colorless transmitters in optical networks, for instance in comparison to tunable lasers and DFB lasers.

Disclosed herein is a method and apparatus for stabilizing and locking the wavelengths of transmitters in WDM networks, which may comprise a plurality of single mode lasers, such as any of the transmission systems above. For instance, the transmitter may be a WDM transmitter that comprises a plurality of FPLDs and/or RSOAs, which may be self-seeded by a plurality of corresponding wavelengths and coupled to a multiplexer. The transmitter may be a colorless transmitter, where the FPLDs and/or RSOAs may operate at about the same wavelength spectrum. The apparatus may comprise a monitoring photodetector for each laser, which may be configured to detect the backward light of the corresponding laser to stabilize and lock the self-seeded wavelength of the laser. Specifically, the photodetector may obtain a photocurrent for the backward light, which may be used to control the laser temperature using a heater/cooler coupled to the laser. Controlling the laser temperature may tune the output wavelength of the laser to match the peak transmission wavelength of the multiplexer.

The WDM transmitter may be used in a plurality of optical networks, such as dense WDM (DWDM) transport or access networks, PONs, SONET/SDH networks, and optical Ethernet networks. FIG. 1 illustrates one embodiment of a PON 100. The PON 100 comprises an optical line terminal (OLT) 110, a plurality of optical network terminals (ONTs) 120, and an optical distribution network (ODN) 130. The PON 100 is a communications network that does not require any active components to distribute data between the OLT 110 and the ONTs 120. Instead, the PON 100 uses the passive optical components in the ODN 130 to distribute data between the OLT 110 and the ONTs 120. Examples of suitable PONs 100 include the asynchronous transfer mode PON (APON) and the broadband PON (BPON) defined by the International Telecommunication Union Telecommunication Standardization Sector (ITU-T) G.983 standard, the Gigabit PON (GPON) defined by the ITU-T G.984 standard, the Ethernet PON (EPON) defined by the IEEE 802.3ah standard, and the wavelength division multiplexing PON (WDM-PON), all of which are incorporated by reference as if reproduced in their entirety.

In an embodiment, the WDM transmitter may comprise a plurality of FPLDs and/or RSOAs, which may be configured to provide a colorless optical transmitter. For instance, the transmitter may be a WDM or DWDM transmitter that comprises a plurality of FPLDs, which may operate at about the same wavelength spectrum. Additionally or alternatively, the transmitter may comprise a plurality of RSOAs, which may be configured for narrow linewidth operation at WDM desired wavelengths. The transmitter may comprise discrete components, such as FP lasers, a WDM filter, rotators, and a reflector. The components may be coupled to one another and mounted on a card or optical platform. Alternatively, the transmitter may be an integrated laser transmitter on a chip. The output wavelengths from the lasers may be tuned by controlling the temperatures of the lasers based on a detected backward light. As such, the output wavelengths may be stabilized and locked to the WDM grid (e.g. wavelength channels). For instance, to align the output wavelengths of the lasers with a plurality of transmission wavelengths or peaks of a WDM filter or multiplexer, the temperature of the FPLDs and/or RSOAs may be changed based on a detected photocurrent of the backward light, as described in detail below. In some embodiments, the FP lasers may also be configured for improved single mode operation, e.g. by allowing a single polarization inside the laser chip or cavity and thus maintaining the output wavelength and intensity, as described in detail below.

Figure 2:
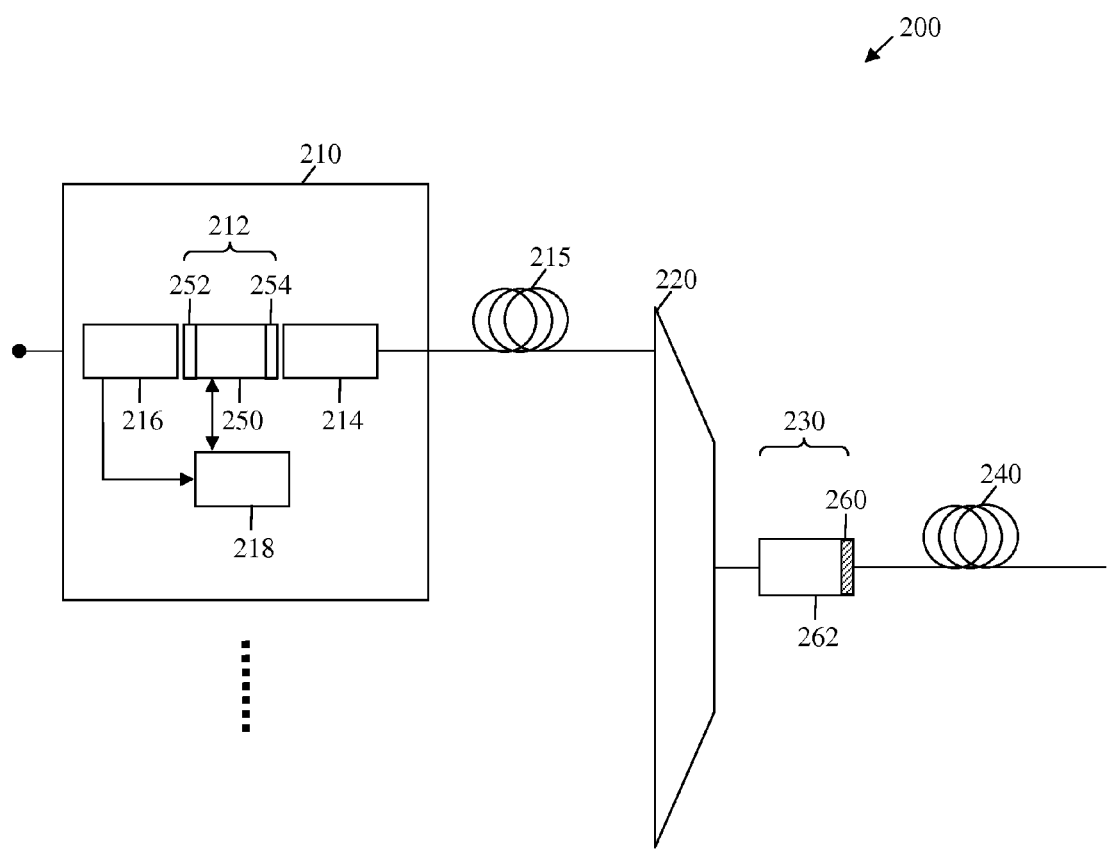
FIG. 2 is a schematic diagram of an embodiment of a WDM transmitter.

FIG. 2 illustrates one embodiment of a WDM transmitter 200, which may be based on an improved single mode laser design. The WDM transmitter 200 may comprise at least one laser transmitter 210 that may be coupled to a multiplexer 220 via a first fiber 215. Although a single laser transmitter 210 is shown coupled to the multiplexer 220, the WDM transmitter 200 may comprise any quantity of laser transmitters 210 that may be coupled to the multiplexer 220 via a corresponding quantity of first fibers 215. Additionally, the WDM transmitter 200 may comprise a light reflector 230, which may be coupled to the multiplexer 220 and a second fiber 240. The second fiber 240 may be coupled to the multiplexer 220 and may couple the WDM transmitter 200 to other network components. For instance, the WDM transmitter 200 may be located at the OLT 110 or any of the ONTs 120, where the second fiber 240 may couple the WDM transmitter 200 to the ODN 130. In an embodiment, the laser transmitters 210 and the multiplexer 220 may all be at different physical locations, perhaps even kilometers apart.

In an embodiment, the laser transmitters 210 may be similarly configured to transmit light at a wavelength range. Each laser transmitter 210 may comprise a laser 212, e.g. an FPLD or RSOA, a rotator 214 coupled to the laser 212, a detector 216 coupled to the laser 212, and a heater/cooler 218 coupled to the detector 216 and the laser 212. The rotator 214 may be configured to support a single polarization inside the laser 212. The light emitted from each laser transmitter 210 may be transported to the multiplexer 220 via the corresponding first fiber 215. The lightwaves transported by the first fibers 215 from the laser transmitters 210 may be combined into a single light wave at the multiplexer 220. Each of the laser transmitters 210 may also be modulated separately, for instance using electric drivers that may be coupled to the laser transmitters 210. The laser 212, the rotator 214, and the detector 216 may be aligned and positioned directly to one another or may be coupled via fibers (not shown). In some embodiments, the laser 212 and the rotator 214 (and/or the detector 216) may be coupled using at least one lens (not shown), which may be positioned between the two.

In an embodiment, the laser 212 may be a FP laser (e.g. FPLD) that comprises a laser chip 250 (e.g. laser gain chip), and a back reflection facet 252 and front reflection facet 254 on opposite sides of the laser chip 250. The back reflection facet 252 may be on the side facing the detector 216 and the front reflection facet 254 may be on the side facing the rotator 214. The laser chip 250 may comprise a semiconductor gain block, which may be biased using electric current or voltage to emit light at a wavelength range. The semiconductor gain block may have a relatively broad gain spectrum, e.g. a spectrum width from about 40 nanometers (nm) to about 50 nm. The laser chip 250, the back reflection facet 252, and the front reflection facet 254 may determine a cavity of the laser 212.

The back reflection facet 252 may be coated with a high-reflection (HR) coating (e.g. metal or thin dielectric film) that reflects the light emitted by the laser chip 250. The front reflection facet 254 may reflect the light in the opposite direction of the back reflection facet 252. As such, a portion of the light emitted by the laser chip 250 may undergo multiple internal reflections, e.g. bounce back and forth inside the cavity and between the back reflection facet 252 and front reflection facet 254. The front reflection facet 254 may allow a portion of the light to exit the laser, e.g. via an aperture. Additionally, the front reflection facet 254 may be coated with an anti-reflection (AR) coating on the side facing the rotator 214. As such, a substantial portion of the light reflected back to the laser 212 may be allowed into the laser cavity. The reflected light may be a seeding light that interacts with the internally reflected light in the light cavity, which may produce a coherent light output from the laser 212. The coherent light output may be transmitted from the front reflection facet 254 to the rotator 214. Since, the seeding light of the laser 212 is initially emitted by the laser 212, the laser 212 is said to be a self-seeding laser or light source.

In an alternative embodiment, the laser 212 may be a RSOA that comprises only a back reflection facet 252 or additionally a front reflection facet 254 that has a substantially smaller reflection than the corresponding reflection facet of a FP laser. As such, the optical gain in the cavity of the RSOA may have weaker periodical dependence to wavelength in comparison to the FP laser.

In an embodiment, the rotator 214 may be a Faraday rotator configured to rotate the polarization of light incoming from one side by about 45 or about −45 degrees and transmit the rotated light at the opposite side. The Faraday rotator may comprise an optical medium that rotates the light, such as a paramagnetic glass. The Faraday rotator may provide a light from any of the two sides that may be rotated by about 45 or about −45 degrees with respect to the other side. For instance, the Faraday rotator may rotate the polarization of an incoming light from the laser 212 and transmit the rotated light to the multiplexer 220. The Faraday rotator may also rotate the polarization of an incoming reflected light from the multiplexer 220 and transmit the rotated light to the laser 212. Thus, a light that passes twice through the Faraday rotator, such as a reflected light in a round-trip path, may be rotated by about 90 or about −90 degrees by the Faraday rotator.

In some embodiments, a polarizer (not shown) may be positioned between the rotator 214 and the laser 212. The polarizer may be configured to transmit a portion of the light that may be polarized similar to the light in the laser 212, e.g. at about zero or about 180 degrees with respect to the polarization of the light in the laser cavity. Additionally, the polarizer may allow back into the laser 212 only reflected light that has substantially the same polarization as the light in the laser cavity. The reflected light that has orthogonal polarization to the light in the laser cavity may affect the laser operation and change its output intensity and/or wavelength, which may not be desired. The undesired light polarizations, such as for stray reflections introduced by the fiber connectors or slices in the fiber, may be suppressed by the polarizer to maintain the light polarization in the laser cavity. The light polarization in the cavity may correspond to the desired output wavelength of the laser. Consequently, single wavelength and single polarization may be improved in the cavity.

In an embodiment, the detector 216 may be a photodetector, e.g. a photodiode, configured to detect the intensity of backward light from the laser 212. The detector 216 may receive the backward light transmitted from the back reflection facet 252 and convert the detected light intensity into a detected photocurrent. The detected photocurrent may be captured and analyzed using a processor or controller (not shown), such as hardware and/or software. The processor or controller may be coupled to the detector 216. The detected photocurrent may be correlated to a shift between the output wavelength of the laser 212 and a corresponding transmission peak of the multiplexer 220, and thus may be used for wavelength stabilization and tuning purposes, as described in detail below. The output wavelength of the laser 212 may drift over time and/or fluctuate due to environmental conditions, such as mechanical vibrations and/or temperature variations. Therefore, the detected photocurrent may be used to compare the output wavelength to a corresponding transmission peak of the multiplexer 220 to stabilize and lock the output wavelength accordingly. The shift between the output wavelength of the laser 212 and the transmission peak of a multiplexer port coupled to the laser transmitter 210 may be controlled based on the detected photocurrent. Hence, the output wavelength may be tuned to align the wavelength with the transmission peak.

In an embodiment, the heater/cooler 218 may be a temperature controller configured to tune and align the output wavelength of the laser 212 with the transmission peak by thermally controlling the laser 212. For instance the heater/cooler 218 may be a thermoelectric cooler (TEC) or just simply a heater that changes the output wavelength of the laser 212 by changing the temperature of the laser 212. The heater/cooler may be electrically coupled to the detector 216 and thermally coupled to the laser 212. As such, the heater/cooler 218 may be controlled based on the detected photocurrent from the detector 216, for instance using a processor or controller (not shown) coupled to the detector 216 and the heater/cooler 218. The heater/cooler 218 may increase or decrease the temperature of the laser 212 to increase or decrease its wavelength and align the wavelength with the transmission peak. The wavelength may be aligned when the detected photocurrent indicates no substantial shift between the output wavelength and the transmission peak.

In an embodiment, the laser 212 may be a RSOA that may have a broad gain spectrum. The gain spectrum of the RSOA may be affected, for instance by unintended internal reflections into the RSOA, which may cause periodical gain peaks in the RSOA. The wavelength locking scheme can be still used to lock the operation wavelength to the peak of a gain period.

In an embodiment, the multiplexer 220 may be an AWG configured to combine a plurality of light waves from the first fibers 215 into a combined light wave that propagates in the second fiber 240. The multiplexer 220 may also filter the light waves that correspond to different laser transmitters 210 at different wavelengths. The multiplexer 220 may be a WDM filter that filters the light at a single wavelength or a wavelength range that is narrower than the wavelength range of the semiconductor gain block. The laser 212 may be configured to transmit light at a single mode and single wavelength, which may substantially overlap with a transmission peak of the multiplexer 220. Typically, the mode spacing in the cavity may be greater than about 100 GHz and the WDM filter may have a bandwidth less than the mode spacing. Accordingly, the combined light from the multiplexer 220 may comprise a plurality of distinct wavelength channels, such as the DWDM channels described in the ITU-T standard G.694.1 and/or the coarse WDM (CWDM) channels described in the ITU-T G.694.2. In other embodiments, the multiplexer 220 may be an optical interleaver, a fiber Bragg grating multiplexer, an optical add-drop multiplexer (OADM), a reconfigurable OADM (ROADM), or any type of WDM filter.

Additionally, the multiplexer 220 may be configured to demultiplex the reflected light from the light reflector 230 into a plurality of light waves or channels and forward each channel to a corresponding laser transmitter 210. Specifically, the demultiplexer 220 may split the reflected light from the light reflector 230 into a plurality of reflected light waves at different wavelengths and forward each wave back to the corresponding laser transmitter 210. The different wavelengths may be used for seeding the corresponding laser transmitters 210.

In an embodiment, the light reflector 230 may be coupled to the multiplexer 220 at one side and to the second fiber 240 at the other side and may comprise a mirror 260 on the side of the second fiber 240. The mirror 260 may be a partially reflective mirror that transmits a portion of the light from the multiplexer 220 down the fiber 240 and reflects back another portion of the light to the multiplexer 220. In an embodiment, the multiplexer 220 may have a finite free spectral range (FSR), which may be larger than or comparable to the gain spectrum of the laser chip 250. For example, for a transmitted light wavelength equal to about 1,550 nm, the (FSR) of the AWG may be larger than about 50 nm. The FSR may comprise a plurality of transmission peaks, which may be about equally spaced across the spectrum. Therefore, without using additional filters, the AWG may allow the transmission of a plurality of wavelength bands from the laser transmitters 210. To provide a single wavelength band from the laser transmitters 210, the mirror 260 may be configured to reflect a portion of the light back to the multiplexer 220 that has a narrower bandwidth than the FSR. For instance, the mirror 260 may be coated with a band-pass coating that matches a desired wavelength band. Thus, the light reflector 230 may promote light transmissions in one wavelength band, such as the C-band (e.g. from about 1,529 to about 1,562 nm), and suppress transmissions at other wavelength bands.

In an alternative embodiment, the light reflector 230 may be coupled to the multiplexer 220 and the second fiber 240 via a coupler (not shown). The coupler may be configured to forward a portion of the combined light from the multiplexer 220 to the light reflector 230 and forward back a reflected light from the light reflector 230 to the multiplexer 220. The coupler may also allow the transmission of a portion of the light from the multiplexer 220 down the second fiber 240. Accordingly, the mirror 260 in the light reflector 230 may be a highly reflective mirror instead of a partially reflective mirror.

Additionally, the light reflector 230 may comprise a rotator 262 coupled to the mirror 260, which may rotate light in the reflector 230 to promote a single polarization in the laser transmitters 210 and hence improve single mode laser operation. The rotator 262 may be a Faraday rotator configured similar to the rotator 214, and the light reflector may be called Faraday rotator mirror. As such, the rotator 262 may rotate an incoming light from the multiplexer 220 and transmit the rotated light to the partially reflected mirror 260. The 262 may also rotate the reflected light from the partially reflected mirror 260 and transmit the rotated light to the multiplexer 220. Thus, a light that passes twice through the rotator 262, such as a reflected light in a round-trip path, may be rotated by about 90 degrees.

In the WDM transmitter 200, the polarization state of the reflected light may be rotated by about 270 degrees by the light reflector 230, where about 90 degrees is introduced by the double pass of the rotator 262 and about 180 degrees is introduced by the mirror reflection. Combining the light reflector 230 and the rotator 214 in the laser transmitter 210 along the round-trip path of a light emitted by the laser 212 may rotate the light reflected back into the laser 212 by about 360 degrees. Thus, the reflected light may be substantially aligned with the light inside the laser cavity. The combination of the rotator 214 and the reflector 230 may be used to substantially align the reflected light in polarization with that of the light inside the laser cavity regardless of random or arbitrary birefringence, which may exist in the fibers between the laser and the reflector components. As such, the polarization dependence of the reflected light may be eliminated and the stability of the single mode operation may be improved. Additionally, since the multiplexer 220 is positioned between the rotator 214 and the rotator 262, unwanted changes in the light polarization that may be introduced by the multiplexer 220 components may be substantially realigned in the laser 212 or isolated from the laser.

In alternative embodiments, the WDM transmitter 200 may be configured based on any configuration that uses self-seeding lasers or light sources, e.g. FPLDs and/or RSOAs. For instance, the WDM transmitter 200 may be configured similar to any of the proposed transmission systems described above for WDM PONs. Accordingly, the WDM transmitter 200 may comprise the self-seeding laser and a reflector that provides the self-seeding light to the laser. The WDM transmitter 200 may also comprise the detector 216 and the heater/cooler 218, which may be coupled to the self-seeding laser and used for wavelength stabilization and locking.

In an embodiment, an analytical model may be used to evaluate the wavelength shift between the laser output and the peak transmission based on the detected photocurrent in the WDM transmitter 200. The analytical model may describe the light interactions between the laser transmitter and reflector components and correlate the detected photocurrent with the wavelength shift. The light interactions may comprise the combination of the light path between the laser transmitter and reflector components in a first cavity and a second cavity adjacent to the first cavity. The first cavity may be the cavity of the laser 212 that is determined by the light path between the back reflection facet 252 and the front reflection facet 254. The second cavity may be an external cavity that is determined by the light path between the front reflection facet 254 of the laser 212 and the mirror 260 of the light reflector 230.

The analytical model may comprise a plurality of optical parameters corresponding to the components along the light path. For instance, the reflectivity of the back reflection facet 252 may be designated by $R_b$, the reflectivity of the front reflection facet 254 may be designated by $R_f$, and the reflectivity of the mirror 260 may be designated by $R_{ext}$. The reflectivity of the mirror 260 $R_{ext}$ may also include any coupling loss between the first cavity and second cavity and/or any other component loss in the second cavity, such as from the multiplexer 220. The reflectivity of the mirror 260 $R_{ext}$ may be dependent on the light frequency or wavelength. For instance, as the wavelength shift between the output wavelength of the laser 212 and the peak transmission increases, transmission losses at the multiplexer 220 may increase and consequently $R_{ext}$ may decrease.

The electric field of light emitted by the laser chip 250 in the first cavity that is incident on the front reflection facet 254 may be represented as $E_i e^{1\omega t}$, where $E_i$ is the field amplitude and $\omega$ is the angular frequency. Further, the electric field of light reflected back from the front reflection facet 254 into the first cavity (or chip cavity) may be represented as $$E_r e^{j\omega t} = \{\sqrt{R_f} + (1-R_f)\sqrt{R_{ext}}e^{-j\omega\tau_{ext}} + (1-R_f)R_{ext}\sqrt{R_f}e^{-2j\omega\tau_{ext}} + \ldots\}E_i e^{j\omega t}, \quad (1)$$

where $\tau_{ext}$ is the round-trip delay time in the second cavity. Hence, the effective reflectivity $r_{eff}$ of light reflected back into the first cavity (e.g. $E_r/E_i$) may be represented as $$r_{eff} = \sqrt{R_f}\left(1 + (1-R_f)\sqrt{\frac{R_{ext}}{R_f}}e^{-j\omega\tau_{ext}}\right), \quad (2)$$

where multiple reflections in the second cavity may be neglected. Additionally, the oscillation condition of light in the cavity may be given by $$\sqrt{R_b}e^{(g-\alpha_m)l}e^{-j\omega\tau}r_{eff} = 1, \quad (3)$$

where l is the length of the laser chip 250, g is the gain of the laser chip 250, $\alpha_m$ is the loss coefficient of the laser chip 250, and $\tau$ the round-trip delay time in the first cavity. The threshold gain $g_{th}$ and oscillation frequency $\omega$ may be obtained by setting the magnitude and argument of the round-trip gain in equation (3) to unity, such as $$g_{th} = \alpha_m - \frac{1}{l}\ln(\sqrt{R_b}|r_{eff}|), \quad (4a)$$

$$\omega = \omega_k + \frac{1}{\tau}\text{Arg}(r_{eff}), \quad (4b)$$

where $\omega_k$ is the $k^{th}$ longitudinal mode frequency in the laser chip 250.

In an embodiment, the second cavity may have a length from about one meter to about ten meters (m), and hence the light frequency in the second cavity may be equal to about few Megahertz (MHz). Typically, the external cavity modes in the second cavity may be closely spaced in comparison to the mode linewidth in the laser chip 250. Maximum light feedback or reflection from the second cavity to the first cavity may occur when the phase is aligned or matched between the electric field in the first cavity and the reflected field from the second cavity. In equation (2), the matched phase may be expressed as $\Phi = \omega\tau_{ext} = 2M\pi$, where M is an integer. As such, the effective reflectivity $r_{eff}$ may be represented as $$r_{eff} = \sqrt{R_f}\left(1 + (1-R_f)\sqrt{\frac{R_{ext}}{R_f}}\right), \quad (5)$$

which may lead to the lowest value of threshold gain. The threshold current of the laser 212 may be assumed to be proportional to the threshold gain, such as $$I_{th}(\lambda) \propto \alpha_m l - \ln(\sqrt{R_b}|r_{eff}(\lambda)|), \quad (6)$$

where the notation in equation (6) is changed from frequency (ω) into wavelength (λ) to correspond to the wavelength parameter that may be used experimentally. The output power of the backward light from the back reflection facet 252 may be expressed as $$P(\lambda) = \eta(I_b - I_{th}(\lambda)), \quad (7)$$

where $I_b$ is the laser bias current and η is the quantum efficiency of the laser chip 250.

Equations (5), (6), and (7) show that the amount of light feedback or reflection into the first cavity contributes to the effective reflectivity $r_{eff}$, is inversely proportional to the threshold current $I_{th}$, and is proportional to the output power P of the laser 212. In equation (5), $R_{ext}$ and hence $r_{eff}$ may decrease as the wavelength shift between the output wavelength of the laser 212 and the peak transmission of the multiplexer 220 increases. Consequently, the wavelength shift may reduce the detected output power of the laser 212, according to equation (7). Since the backward light of the laser 212 is detected and converted to a photocurrent by the detector 216, the wavelength shift may also reduce the detected photocurrent. Equations (5), (6), and (7) may be used to correlate the wavelength shift and the detected photocurrent.

Figure 3:
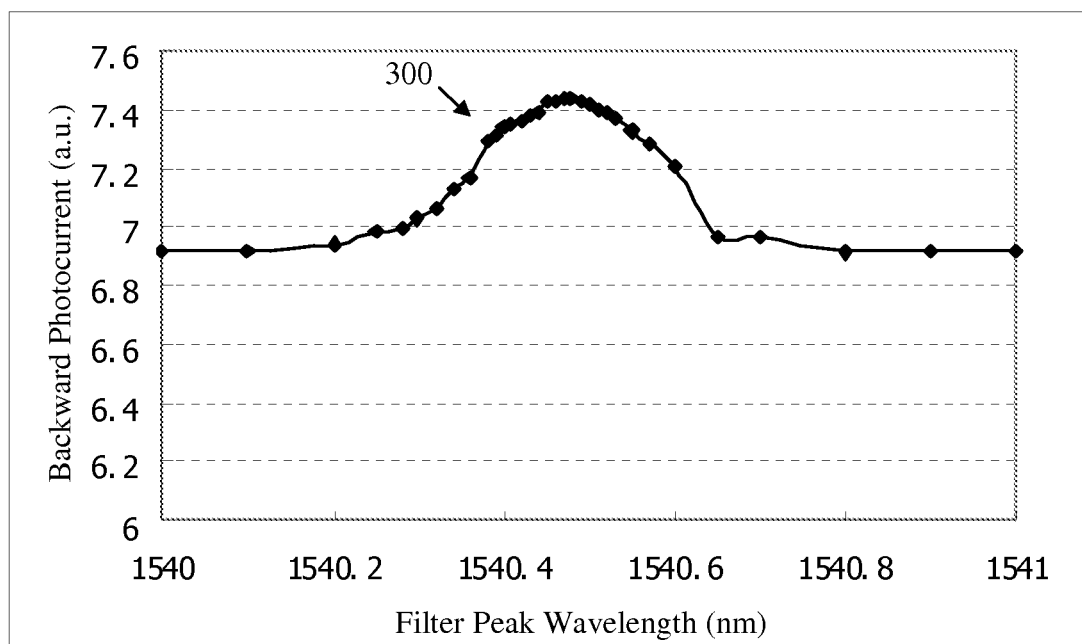
FIG. 3 is a chart of an embodiment of a detected photocurrent for laser output light.

FIG. 3 illustrates an embodiment of a detected photocurrent 300 for a backward light from a FPLD configured similar to the laser 212. The FPLD is coupled to a tunable optical band-pass filter that is used in place of a multiplexer or AWG to produce a wavelength shift between the output of the FPLD and the filter peak wavelength. The FPLD has a threshold current equal to about nine milliamp (mA) and is biased at about 35 mA. The tunable filter has a Gaussian shape spectrum and a bandwidth equal to about 0.22 nm at about three dB. The detected photocurrent 300 is obtained using a detector similar to the detector 216. The detected photocurrent 300 is represented by a curve that comprises a plurality of photocurrent values obtained experimentally by varying the filter peak wavelength. The filter peak wavelength is varied from about 1,540 nm to about 1,541 nm.

The highest photocurrent value is obtained at a filter peak wavelength value equal to about 1,540.48 nm, e.g. around the center of the range of filter peak wavelength values. The photocurrent value decreases on both sides of the highest photocurrent value and is substantially constant at the two edges of the filter peak wavelength range. The highest photocurrent value is equal to about 7.4 measurement units, which is an arbitrary unit (a.u.), and the constant photocurrent value at the edges of the filter peak wavelength range is equal to about 6.9 a.u. The increase in the detected photocurrent value around the center of the wavelength range may be attributed to a negligible wavelength shift (e.g. at about 1,540.48 nm) between the laser output and the filter peak wavelength. The decrease in the detected photocurrent value away from the center of the range may be attributed to the increase in losses in the cavity due to the increase in the wavelength shift between the laser output and the filter peak wavelength. A negligible change in detected photocurrent value at the edges of the range may result from reaching a threshold where negligible light is reflected back and no substantial change is detected in backward light.

Figure 4:
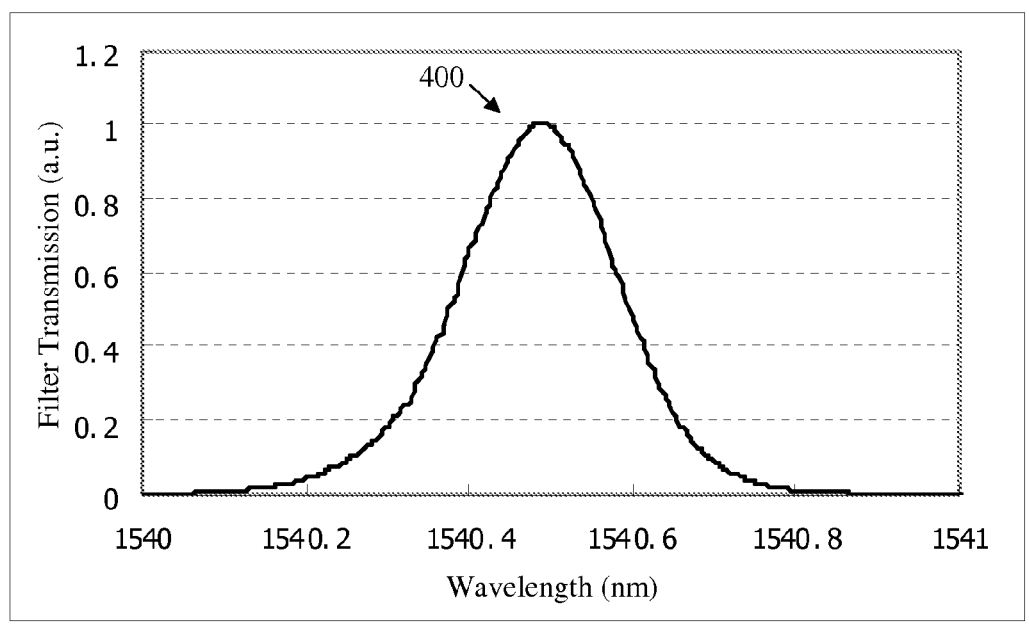
FIG. 4 is a chart of an embodiment of a filter transmission spectrum.

FIG. 4 illustrates an embodiment of a filter transmission spectrum 400 that corresponds to the tunable filter used in conjunction with the FPLD to obtain the detected photocurrent 300. In FIG. 4, the filter transmission spectrum 400 is represented by a curve that comprises a plurality of transmission values across the same wavelength range shown in FIG. 3. The highest transmission value in the filter transmission spectrum 400 is located at a wavelength equal to about the wavelength of the highest value of the detected photocurrent 300, e.g. at about 1,540.48 nm. The alignment between the wavelengths of the highest detected photocurrent and the highest filter transmission indicates a wavelength matching between the laser output and the filter transmission peak, where the wavelength shift is equal to about zero or is minimum. Further, as the transmission value in the filter transmission spectrum 400 decreases away from the minimum wavelength shift condition, e.g. away from about 1,540.48, the photocurrent value in the detected photocurrent 300 decreases. Since the minimum wavelength shift corresponds to the maximum detected photocurrent in the photocurrent vs. wavelength pattern, the pattern may be used to stabilize and lock the laser wavelength to the filter peak wavelength.

The wavelength shift that corresponds to the data in FIG. 3 and FIG. 4 is obtained by changing the filter peak wavelength of a tunable filter coupled to a FPLD. In a WDM transmission system, such as the WDM transmitter 200, the transmission peak of the filter may not be changed but the wavelength shift may be caused by tuning the laser output using a temperature controller, as described above. As such, the detected photocurrent for the backward light of the laser may be obtained and plotted vs. a range of wavelengths or alternatively vs. a corresponding range of laser temperature. For instance, the gain spectrum of the laser and its resonance wavelength (e.g. output wavelength) may shift to longer wavelengths as the laser temperature increases. The resonance wavelength of the laser may be determined by the refractive index of the laser chip that may vary with changes in temperature. The gain spectrum of the laser may depend on the temperature of the laser since changing the temperature also changes the band gap that determines the gain spectrum. In an embodiment, the resonance wavelength that corresponds to a cavity mode in the laser may be shifted to a longer wavelength by increasing the temperature in a linear manner. For instance, the change in wavelength due to temperature variation may be expressed by the relation $$\lambda = \lambda_0 + \xi \times (T - T_0),$$

where $T_0$ is the initial reference temperature, $\lambda_0$ is the mode wavelength at $T_0$, and ξ is the slope of the linear relation between wavelength and temperature. For example, the slope ξ may be equal to about 0.1 nm/° C. for edge lasers with wavelengths around 1,550 nm.

Changing the laser temperature may also change the threshold current of the laser and consequently its output power. Therefore, the expected shape of the detected photocurrent vs. temperature may be slightly different from the shape of the detected photocurrent 300. For instance, the detected photocurrent vs. temperature may not be symmetrical around the temperature point where the maximum photocurrent value corresponding to the minimum wavelength shift may be located. The photocurrent values at the higher temperatures side of the maximum photocurrent value may be less than the detected photocurrent values at the lower temperatures side. Since the minimum wavelength shift may still be aligned with the maximum detected photocurrent in the photocurrent vs. temperature pattern, the pattern may be used to stabilize and lock the laser wavelength to the filter transmission peak in a manner similar to the photocurrent vs. wavelength pattern above.

Typically, other aspects of the system may contribute to light losses along the path between the laser transmitter and reflector, such as any bending in the fiber and/or laser aging that may degrade laser gain. Such parameters may reduce the level of detected output power and hence of detected photocurrent. However, these parameters may be wavelength independent in the range of laser output wavelengths (e.g. around 1,550 nm) and therefore may not affect wavelength stabilizing and locking based on the photocurrent wavelength shift correlation.

Figure 5:
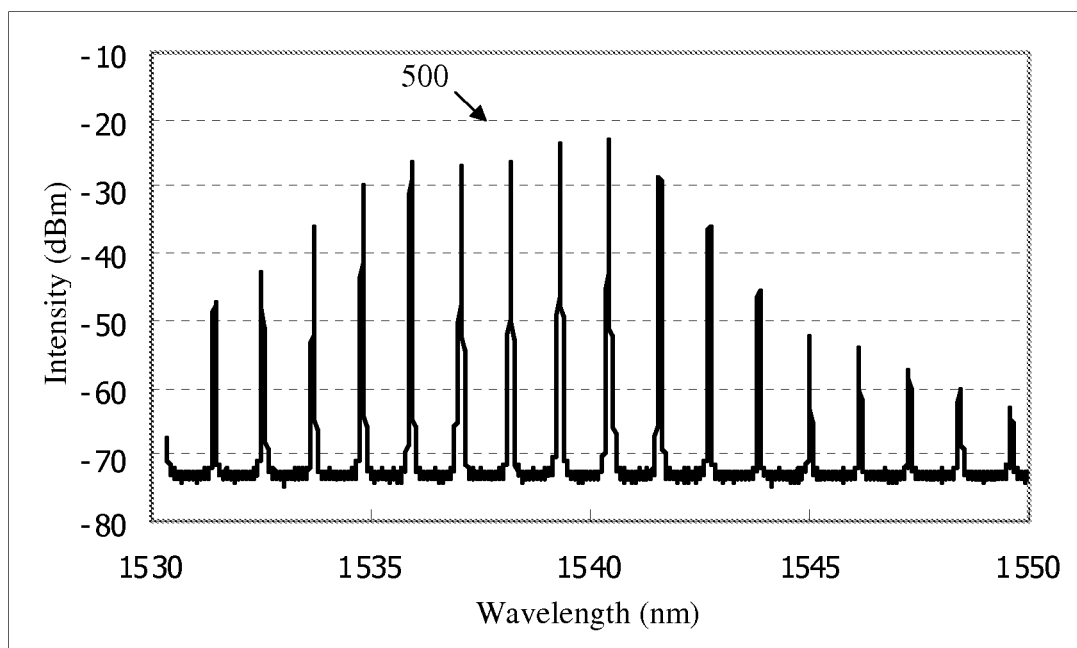
FIG. 5 is a chart of an embodiment of a free-running laser output spectrum.

FIG. 5 illustrates an embodiment of a laser output spectrum 500, for a FP laser without self-seeding and wavelength-locking. The laser output spectrum 500 may comprise a plurality of peaks at a plurality of wavelengths, which may correspond to a plurality of modes (longitudinal modes) in the cavity. The longitudinal modes may be determined by the cavity length and the refractive index of the semiconductor gain block in the laser. The longitudinal modes and corresponding wavelengths may overlap with the wavelength range of the semiconductor gain block. The number of the longitudinal modes that may be supported may be limited by the width of the gain spectrum. For instance, for each mode, the wavelength may be obtained according to $$\lambda = 2nl/m,$$

where $\lambda$ is the wavelength, n is the refractive index of the semiconductor gain block, l is the cavity length, and m is the mode number. The spacing between the modes may be determined by the length of the cavity. For instance, the mode spacing $\Delta v$ may be obtained according to $$\Delta v = c/2nl,$$

where c is the speed of light.

Figure 6:
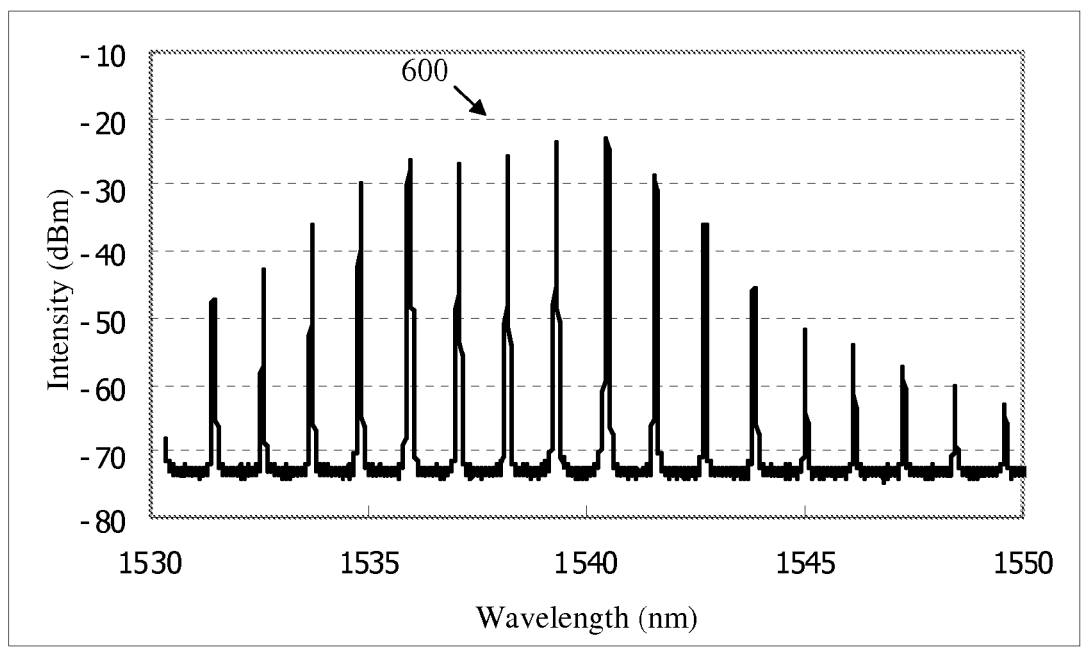
FIG. 6 is a chart of an embodiment of a self-seeded laser output spectrum, where the output wavelength is far separated from the filter transmission peak.

FIG. 6 illustrates an embodiment of a self-seeded laser output spectrum 600 for a FPLD. The FPLD is self-seeded at a selected wavelength (e.g. 1,540.48 nm) using a reflector. The FPLD is also coupled to a filter. However, the filter has a transmission peak that is shifted by about 0.5 nm from the selected wavelength and therefore may not be wavelength-locked. Accordingly, the self-seeded laser output spectrum 600 may comprise a plurality of peaks at a plurality of wavelengths, which may be similar to the laser output spectrum 500. Since the output wavelength is not matched with the transmission peak of the filter, the laser may continue to have multi-mode operation even when using a single seeding wavelength.

Figure 7:
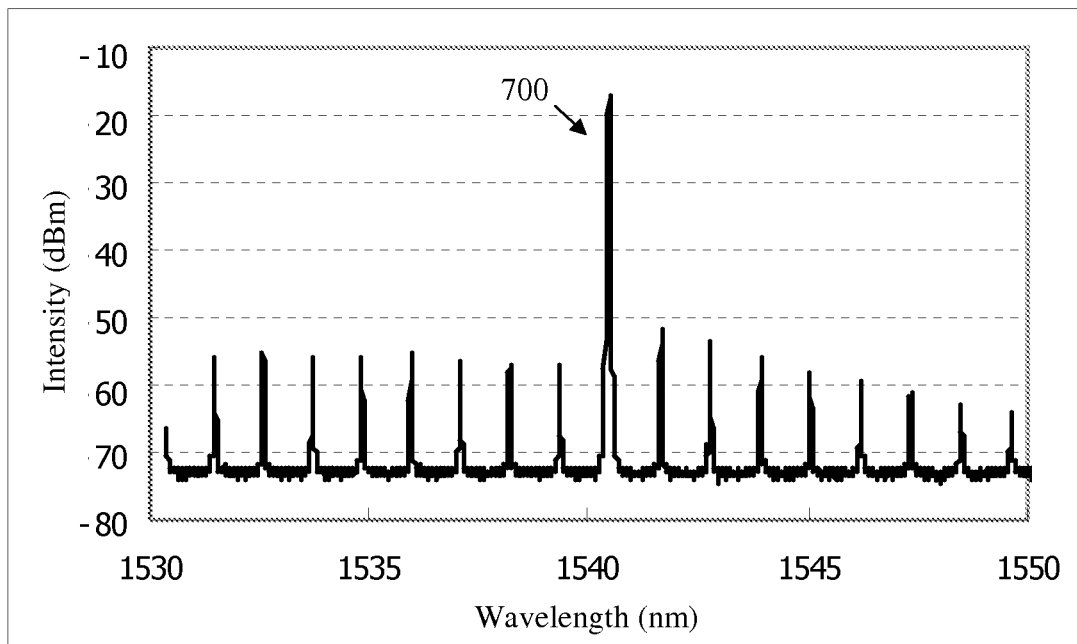
FIG. 7 is a chart of an embodiment of a self-seeded wavelength-locked laser output spectrum.

FIG. 7 illustrates an embodiment of a self-seeded and wavelength-locked laser output spectrum 700, which corresponds to a FPLD. The FPLD is self-seeded at a selected wavelength (e.g. 1,540.48 nm) using a reflector. Additionally, the FPLD is wavelength-locked using a filter, where the transmission peak of the filter is substantially aligned with the selected self-seeding wavelength. Accordingly, the self-seeded and wavelength-locked laser output spectrum 600 may comprise a single "pronounced" peak at the selected wavelength that corresponds to the excited mode in the cavity. The self-seeded and wavelength-locked laser output spectrum 600 may also comprise a plurality of relatively suppressed peaks at a plurality of wavelengths corresponding to other modes. Since the output wavelength (seeding wavelength) is matched with the transmission peak of the filter, the laser may have a single mode operation and transmit light at the single selected wavelength. The mode suppression ratio of the laser for the remaining modes may be greater than about 30 dB.

Figure 8:
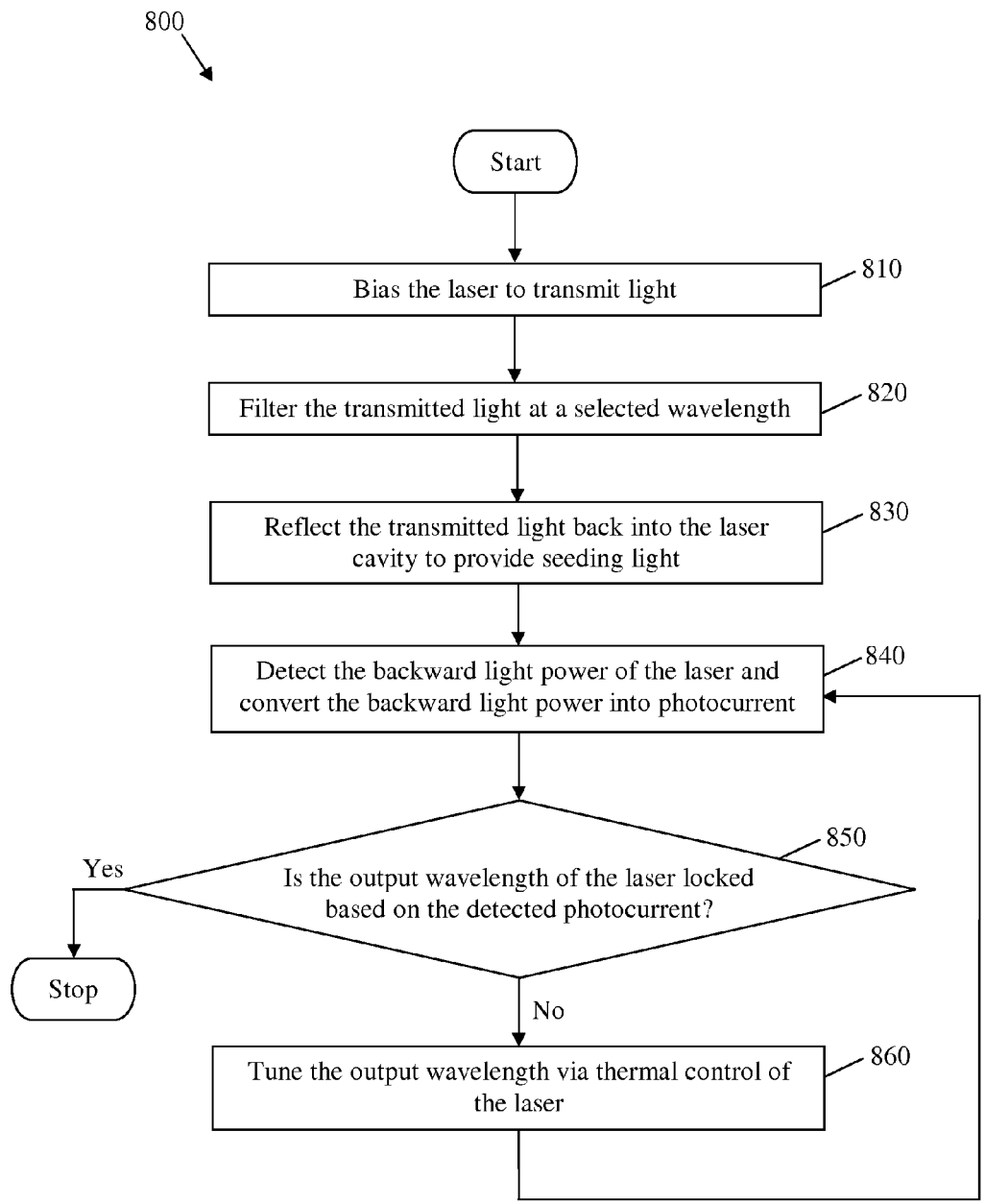
FIG. 8 is a flowchart of an embodiment of a wavelength stabilizing and locking method.

FIG. 8 illustrates one embodiment of a wavelength stabilizing and locking method 800, which may be used to stabilize and lock the output wavelength of a laser, such as a FPLD or RSOA. The laser may be self-seeded, e.g. using a mirror along the path of the transmitted light, and the laser output may be filtered, e.g. using a WDM filter, AWG, or multiplexer. The transmission peak of the filter may be aligned with the selected output wavelength of the laser by tuning the laser thermally, e.g. using a heater/cooler. The wavelength stabilizing and locking method 800 may be implemented by at least the components described above, at least some of which may be operated in conjunction with one or more application specific integrated circuits (ASICs) and/or any general-purpose network component, such as a computer or network component with sufficient processing power, memory resources, and network throughput capability to handle the necessary workload placed upon it. For example, the wavelength stabilizing and locking method 800 may be used in a WDM transmission system, such as the WDM transmitter 200.

The method 800 may begin at 810, where the laser may be biased to transmit light. For instance, the laser may be biased by a current amount that exceeds the threshold current of the laser chip. At block 820, the transmitted light may be filtered at a selected wavelength, which may correspond to one of the modes excited in the laser cavity. For instance, the laser may be coupled to an AWG port that has a peak transmission aligned with the selected wavelength. At block 830, the transmitted light may be reflected back into the laser cavity to provide the seeding (feedback) light. For instance, the laser may be coupled to a reflector, e.g. mirror, which may reflect at least a portion of the light back into the laser cavity.

Next, at block 840, the backward light power of the laser may be detected and converted into photocurrent. For instance, the backward light may be detected from the back reflection facet of the laser using a photodetector coupled to the laser. At block 850, the method 800 may determine if the output wavelength of the laser is locked based on the detected photocurrent. For instance, the output wavelength may be locked to the transmission peak of the filter if the detected photocurrent has reached a maximum value across the filter transmission spectrum. If the condition in block 850 is met, e.g. when the output wavelength of the laser is locked, the method 800 may end. Otherwise, the method 800 may proceed to block 860, where the output wavelength may be tuned via thermal control of the laser. For instance, the laser may be heated/cooled using a heater/cooler coupled to the laser to increase or decrease the output wavelength of the laser and thus decrease the wavelength shift between the output wavelength and the transmission peak of the filter. The method 800 may then return to block 840 to detect again the photocurrent of the backward light. The processes in blocks 840 to block 860 may be repeated until the wavelength shift between the output wavelength and the filter transmission peak is equal to about zero and the laser wavelength is stabilized and locked. As such, a detected photocurrent of a backward light from a laser may be correlated with a wavelength shift between a wavelength of the laser and a filter transmission peak, and the wavelength of the laser may be thermally tuned to substantially maximize the detected photocurrent and substantially minimize the wavelength shift.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A system comprising:
    a laser configured to generate a light having a wavelength and a polarization;
    an optical polarization rotator configured to rotate the polarization of the light;
    a photodetector configured to produce an electrical indication of the wavelength;
    at least one processor coupled to the photodetector and configured to:
        receive the electrical indication;
        determine a difference between the wavelength and a filter transmission peak; and
        adjust the laser to vary the wavelength, thereby reducing or substantially eliminating the difference and aligning the wavelength with the filter transmission peak;
    an arrayed waveguide grating (AWG) optically coupled to the optical polarization rotator such that the optical polarization rotator is positioned between the laser and the AWG; and
    a reflector coupled to the AWG such that the AWG is positioned between the optical polarization rotator and the reflector,
    wherein the reflector comprises:
        a first side facing the laser;
        a second side facing an optical network, wherein the second side comprises a partially reflective coating that is configured to allow some light from the laser to pass through the reflector; and
        a second optical polarization rotator coupled to the reflector such that the second optical polarization rotator is positioned between the first side of the reflector and the AWG and there are no optical components other than an optional optical fiber between the reflector and the second optical polarization rotator, and
    wherein there are no optical components other than either an optional optical fiber or an optional lens between the laser and the optical polarization rotator.

2. The system of claim 1 further comprising a temperature controller coupled to the laser and the processor, wherein the processor adjusts the laser by heating or cooling the laser using the temperature controller.

3. The system of claim 1, wherein the partially reflective coating comprises a band pass coating configured to reflect light at the filter transmission peak without substantially reflecting light at other wavelengths.

4. The system of claim 1 further comprising:
    a plurality of the lasers each configured to generate the light at a unique wavelength;
    a plurality of the optical polarization rotators each associated with only one of the lasers, each configured to rotate the polarization of the light from the associated laser, and each optically coupled to the AWG;
    a plurality of the photodetectors each associated with only one of the lasers and each configured to produce the electrical indication of the unique wavelength for the associated laser; and
    a plurality of the processors each associated with only one of the lasers, each coupled to the photodetector associated with the same laser with which the processor is associated, and each processor configured to:
        receive the electrical indication;
        determine the difference between the unique wavelength and a filter transmission peak associated with the unique wavelength of the laser associated with the processor; and
        adjust the laser associated with the processor to vary the unique wavelength, thereby reducing or substantially eliminating the difference and aligning the wavelength with the filter transmission peak.

5. The system of claim 4, wherein the AWG comprises one filter transmission peak for each of the lasers, and wherein the second optical polarization rotator is configured to rotate light at all of the unique wavelengths.

6. A method comprising:
correlating a detected photocurrent of a backward light from a laser with a wavelength shift between a wavelength of an output light and a filter transmission peak; and
thermally tuning the wavelength of the laser to substantially maximize the detected photocurrent and substantially minimize the wavelength shift,
wherein a detected power of the light P is inversely proportional to a threshold current $I_{th}$ of the laser according to $P(\lambda)=\eta(I_b-I_{th}(\lambda))$, where $\lambda$ is the wavelength of the laser, $I_b$ is a bias current of the laser, and $\lambda$ is a quantum efficiency of the laser.

7. The method of claim 6, wherein the threshold current $I_{th}$ is inversely proportional to an effective reflectivity $r_{eff}$ of feedback light of the laser according to $I_{th}(\lambda) \propto \alpha_m l - \ln(\sqrt{R_b}|r_{eff}(\lambda)|)$, where $\alpha_m$ is a loss coefficient of the laser, l is a length of a cavity in the laser, and $R_b$ is a reflectivity of a back reflection facet of the laser.

8. The method of claim 7, wherein the effective reflectivity $r_{eff}$ is proportional to a reflectivity of a front reflection facet of the laser $R_f$, and a reflectivity of the feedback light $R_{ext}$ according to $$r_{eff} = \sqrt{R_f}\left(1+(1-R_f)\sqrt{\frac{R_{ext}}{R_f}}\right).$$

9. A system comprising:
a laser configured to generate a light having a wavelength and a polarization;
an optical polarization rotator configured to rotate the polarization of the light;
a photodetector configured to produce an electrical indication of the wavelength;
at least one processor coupled to the photodetector and configured to:
receive the electrical indication;
determine a difference between the wavelength and a filter transmission peak; and
adjust the laser to vary the wavelength, thereby reducing or substantially eliminating the difference and aligning the wavelength with the filter transmission peak;
an arrayed waveguide grating (AWG) optically coupled to the optical polarization rotator such that the optical polarization rotator is positioned between the laser and the AWG;
a reflector coupled to the AWG such that the AWG is positioned between the optical polarization rotator and the reflector;
a second optical polarization rotator coupled to the reflector such that the second optical polarization rotator is positioned between the reflector and the AWG and there are no optical components other than an optional optical fiber between the reflector and the second optical polarization rotator; and
a splitter coupled to the AWG such that the AWG is positioned between the optical polarization rotator and the splitter;
wherein there are no optical components other than either an optional optical fiber or an optional lens between the laser and the optical polarization rotator,
wherein the reflector is coupled to the splitter such that the splitter is positioned between the reflector and the AWG,
wherein the splitter is configured to:
split the light into a first part and a second part;
forward the first part to an optical network; and
forward the second part to the reflector, and
wherein the reflector is configured to reflect substantially all of the second part back to the splitter.

10. A method comprising:
generating, via a laser, a light having a polarization and a wavelength;
rotating the polarization of the light a first time;
detecting the wavelength of the light;
determining a difference between the wavelength and a filter transmission peak;
adjusting the laser to vary the wavelength, thereby reducing or substantially eliminating the difference and aligning the wavelength with the filter transmission peak;
multiplexing the rotated light with a plurality of other lights prior to reflecting at least part of the rotated light, wherein the other lights have other wavelengths that are different from the wavelength;
rotating the rotated light a second time prior to the reflecting;
rotating the reflected light a third time after the reflecting;
rotating the reflected light a fourth time prior to the reflected light returning to the laser, such that the light is rotated four times between being generated by the laser and returning to the laser; and
wavelength demultiplexing the reflected light from the other lights prior to rotating the reflected light the fourth time.

11. The method of claim 10, wherein reflecting at least part of the rotated light further comprises:
splitting the rotated light into a first part and a second part;
forwarding the first part to an optical network; and
forwarding the second part to a reflector that reflects substantially all of the second part.

12. The method of claim 10, wherein reflecting at least part of the rotated light further comprises:
allowing some of the rotated light to pass through a reflector without being reflected; and
filtering some of the rotated light within the reflector.

13. The method of claim 10 further comprising filtering the reflected light prior to the reflected light reaching the laser.

14. The method of claim 10, wherein the multiplexing and the demultiplexing occur in an arrayed waveguide grating (AWG), wherein a desired wavelength is a transmission peak in the AWG, and wherein the laser is adjusted by varying a temperature of the laser.

* * * * *

UNITED STATES PATENT AND TRADEMARK OFFICE
CERTIFICATE OF CORRECTION

PATENT NO.       : 8,559,821 B2
APPLICATION NO.  : 12/629425
DATED            : October 15, 2013
INVENTOR(S)      : Yang Jing Wen et al.

It is certified that error appears in the above-identified patent and that said Letters Patent is hereby corrected as shown below:

In the Claims

Column 17, lines 1-13, Claim 6 should read

--6. A method comprising:

correlating a detected photocurrent of a backward light from a laser with a wavelength shift between a wavelength of an output light and a filter transmission peak; and thermally tuning the wavelength of the laser to substantially maximize the detected photocurrent and substantially minimize the wavelength shift, wherein a detected power of the light $P$ is inversely proportional to a threshold current $I_{th}$ of the laser according to $P(\lambda) = \eta(I_b - I_{th}(\lambda))$, where $\lambda$ is the wavelength of the laser, $I_b$ is a bias current of the laser, and $\eta$ is a quantum efficiency of the laser.--.

Signed and Sealed this
Twenty-sixth Day of November, 2013

Margaret A. Focarino
*Commissioner for Patents of the United States Patent and Trademark Office*